United States Patent
Davis

(10) Patent No.: US 10,520,349 B2
(45) Date of Patent: Dec. 31, 2019

(54) CIRCUIT FOR SIMULATING A CAPACITANCE FUEL PROBE

(71) Applicant: Ultra Electronics Limited, Greenford, Middlesex (GB)

(72) Inventor: Andrew Ceri Davis, Cheltenham (GB)

(73) Assignee: Ultra Electronics Limited (GB)

( * ) Notice: Subject to any disclaimer, the term of this patent is extended or adjusted under 35 U.S.C. 154(b) by 243 days.

(21) Appl. No.: 15/600,172

(22) Filed: May 19, 2017

(65) Prior Publication Data
US 2017/0336241 A1    Nov. 23, 2017

(30) Foreign Application Priority Data
May 19, 2016  (GB) .................................. 1608835.3

(51) Int. Cl.
| | | |
|---|---|---|
| *G01F 23/26* | (2006.01) | |
| *G01F 25/00* | (2006.01) | |
| *G01R 31/28* | (2006.01) | |
| *G06G 7/62* | (2006.01) | |

(52) U.S. Cl.
CPC .......... *G01F 23/266* (2013.01); *G01F 23/265* (2013.01); *G01F 25/0076* (2013.01); *G01R 31/2829* (2013.01); *G06G 7/62* (2013.01); *G01F 23/263* (2013.01)

(58) Field of Classification Search
CPC .................................................. G01F 23/266
USPC ........................................................ 702/52
See application file for complete search history.

(56) References Cited

U.S. PATENT DOCUMENTS

| 3,534,606 A | 10/1970 | Stamler et al. |
| 4,080,462 A | 3/1978 | Brookes et al. |
| 4,214,479 A * | 7/1980 | Maier .................... G01F 23/266 361/284 |
| 4,347,740 A | 9/1982 | Townsend |
| 4,441,157 A | 4/1984 | Gerchman et al. |
| 4,517,547 A * | 5/1985 | Gray ..................... G01N 27/223 324/665 |
| 4,676,100 A * | 6/1987 | Eichberger ............ G01F 23/266 324/601 |

(Continued)

FOREIGN PATENT DOCUMENTS

| CN | 103743420 A | 4/2014 |
| JP | 62223623 A | 10/1987 |
| SU | 1201686 A | 12/1985 |

OTHER PUBLICATIONS

Intellectual Property Office of the UK; Search report for GB1608835.3; dated Oct. 3, 2016; 3 pages; South Wales, GB.

*Primary Examiner* — Ricky Ngon
(74) *Attorney, Agent, or Firm* — RatnerPrestia

(57) ABSTRACT

A circuit for simulating a capacitance fuel probe, the circuit comprising: an input for receiving an alternating current (AC) excitation signal; an output for outputting an output signal representing a capacitance of the simulated fuel probe; a single reference capacitance; a first amplifier connected to the reference capacitance, the first amplifier being configured to cause a current flow through the reference capacitance; a second, variable gain, amplifier, the second, variable gain amplifier being configured to output an AC signal representing a multiple of the current flow through the reference capacitance, wherein the AC signal output by the second amplifier is used to generate the output signal.

7 Claims, 3 Drawing Sheets

(56) References Cited

U.S. PATENT DOCUMENTS

| | | | | |
|---|---|---|---|---|
| 4,706,203 A | * | 11/1987 | Ramsdale | G01F 23/266 |
| | | | | 702/52 |
| 4,841,227 A | * | 6/1989 | Maier | G01F 23/266 |
| | | | | 324/608 |
| 5,049,878 A | * | 9/1991 | Stern | G01F 23/266 |
| | | | | 324/679 |
| 5,303,179 A | | 4/1994 | Kumar | |
| 5,485,115 A | | 1/1996 | Nordeng | |
| 5,627,304 A | | 5/1997 | Jacob et al. | |
| 2003/0006902 A1 | | 1/2003 | Tullis et al. | |
| 2005/0017737 A1 | | 1/2005 | Yakabe et al. | |
| 2005/0030046 A1 | | 2/2005 | Yakabe et al. | |
| 2009/0120159 A1 | | 5/2009 | Barlesi et al. | |
| 2011/0115501 A1 | | 5/2011 | He et al. | |

* cited by examiner

US 10,520,349 B2

CIRCUIT FOR SIMULATING A CAPACITANCE FUEL PROBE

TECHNICAL FIELD

The present application relates to a circuit for simulating a capacitance fuel probe.

BACKGROUND TO THE INVENTION

Passive capacitive fuel probes come in two basic types: AC and DC. Both probe types are excited by a vehicle's fuel system (normally by a fuel gauge/conditioner unit) with an alternating current (AC) signal which typically has frequency in the range 1-10 kHz. The AC probe type produces a small AC output current. The DC probe type incorporates two diodes in a charge pump configuration and produces a half-wave rectified output current. The diodes introduce an error, which is measured and compensated for by the gauge/conditioner unit.

FIG. 1 is a schematic representation of a typical DC fuel probe. An AC excitation signal is routed to the low impedance ('Lo Z') and 'Return' terminals. The current output is measured at the high impedance ('Hi Z') terminal. Most gauges/conditioners have very low input impedance, in order to eliminate the effect of parasitic cable capacitance between the probe and the gauge.

It is reasonably straightforward to simulate an AC probe. There are a number of practical ways of producing a small AC current proportional to the desired capacitance. The situation is more difficult for DC probes as any variation between the electrical characteristics of the simulator and a real probe could have an unclear impact on the gauge's diode compensation algorithm.

It is known to use a number of selectable fixed-value precision capacitors (which can be selected using low capacitance relays) to create an electrically identical simulation of a probe. However, this approach requires costly specialised precision components and makes it difficult to achieve a high resolution.

Additionally, known simulation circuits normally only operate accurately with measuring circuits that have constrained operating characteristics (e.g. voltage/frequency/high impedance measurement impedance), as a result of the use in such simulation circuits of analogue to digital to analogue conversion.

Accordingly, a need exists for a method of accurately simulating an AC or DC fuel probe with high resolution and with a minimum of precision reference capacitors.

SUMMARY OF INVENTION

According to a first aspect of the present invention there is provided a circuit for simulating a capacitance fuel probe, the circuit comprising: an input for receiving an alternating current (AC) excitation signal; an output for outputting an output signal representing a capacitance of the simulated fuel probe; a single reference capacitance; a first amplifier connected to the reference capacitance, the first amplifier being configured to cause a current flow through the reference capacitance; a second, variable gain, amplifier, the second, variable gain amplifier being configured to output an AC signal representing a multiple of the current flow through the reference capacitance, wherein the AC signal output by the second amplifier is used to generate the output signal.

The circuit of the present invention permits precise and accurate simulation of a capacitance fuel probe without requiring a large number of costly precision components.

The circuit may further comprising a first diode and a second diode which are operative to generate a half wave rectified output signal.

The single reference capacitance may comprise a single precision capacitor.

The circuit may further comprise a variable resistance for adjusting the gain of the second, variable gain, amplifier.

The variable resistance may be implemented using an electronically programmable resistor.

The output signal may represent a decimal fraction in the range 0 to 1 of the reference capacitance.

The circuit may further comprise an output resistor connected to the output of the second amplifier for converting the AC signal output by the second amplifier into an output current.

BRIEF DESCRIPTION OF THE DRAWINGS

Embodiments of the invention will now be described, strictly by way of example only, with reference to the accompanying drawings, of which.

DESCRIPTION OF THE EMBODIMENTS

Figure 1:
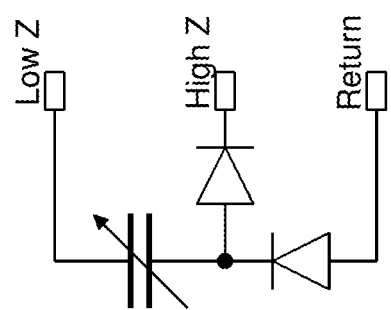
FIG. 1 is a schematic representation of a typical DC fuel probe.
Figure 2:
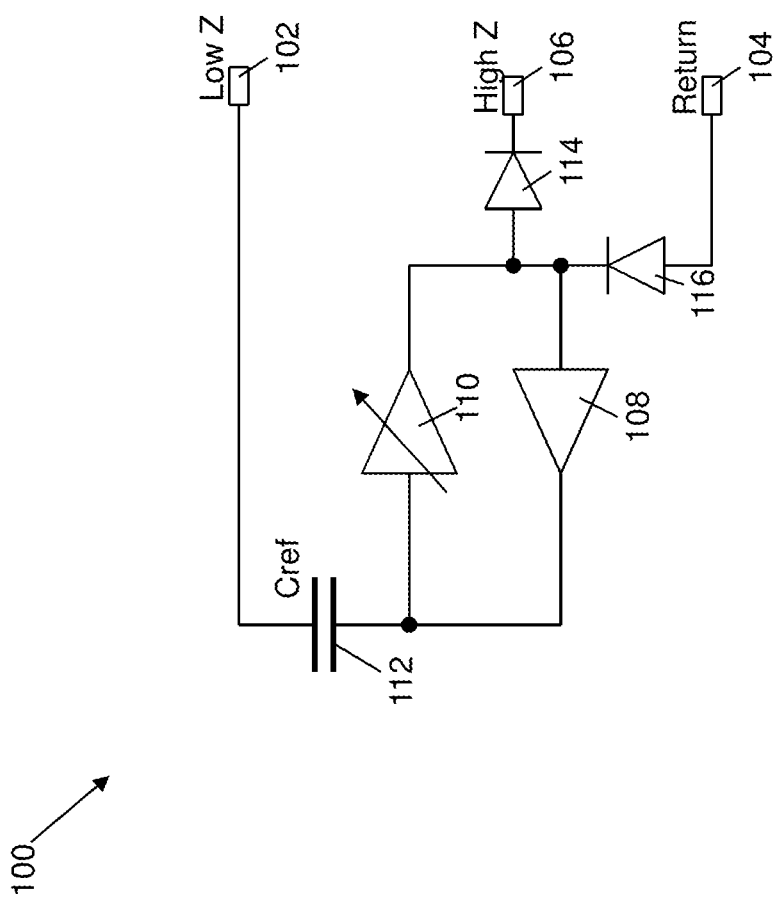
FIG. 2 is a schematic representation of a theoretical model of a circuit for simulating a DC capacitance fuel probe.

Referring first to FIG. 2, a theoretical model of a circuit for simulating a DC capacitance fuel probe is shown generally at 100. The circuit 100 is includes a low impedance input terminal 102, a return terminal 104 and a high impedance terminal 106. As in the prior art circuit of FIG. 1, an AC excitation signal is input between the low impedance terminal 102 and the return terminal 104, and the output current is measured at the high impedance terminal 106.

The circuit 100 includes a first amplifier 108 and a second, variable gain, amplifier 110. An output of the first amplifier is connected to an input of the second, variable gain amplifier 110. A reference capacitance 112, which is preferably a single precision capacitor of known value, is connected between the low impedance terminal 102 and a node which connects the output of the first amplifier 108 to the input of the second, variable gain amplifier 110.

An output of the second, variable gain, amplifier 110 is connected to an input of the first amplifier 108. The anode of a first diode 114 is connected to the node which connects the output of the second amplifier 110 to the input of the first amplifier 108, and the cathode of the first diode 114 is connected to the high impedance terminal 106. A second diode 116 is connected between the return terminal 104 and the node which connects the output of the second amplifier 110 to the input of the first amplifier 108, with the anode of the second diode 116 being connected to the return terminal 106 and the cathode of the second diode 116 being connected to the node. The first and second diodes 114, 116 generate a half-wave rectified output signal which is output via the high impedance terminal 106.

The first amplifier 108 measures the voltage at the node between the first and second diodes 114, 116 and presents an exact copy of this voltage to the reference capacitance 112. This results in a current flow through the reference capacitance 112 exactly as if it were connected to the node between the first and second diodes 114, 116, without producing this current at the output terminals 104, 106 of the circuit.

The second amplifier 110 measures the current through the reference capacitance 112 and outputs a precise multiple (greater than or more typically less than one) of this current. By adjusting the gain of the second amplifier 110, the current output by the second amplifier 110 to the node between the first and second diodes 114, 116 can be adjusted. Thus, any desired output current (representing any desired capacitance for simulating a fuel probe) can be output by the circuit 100.

Figure 3:
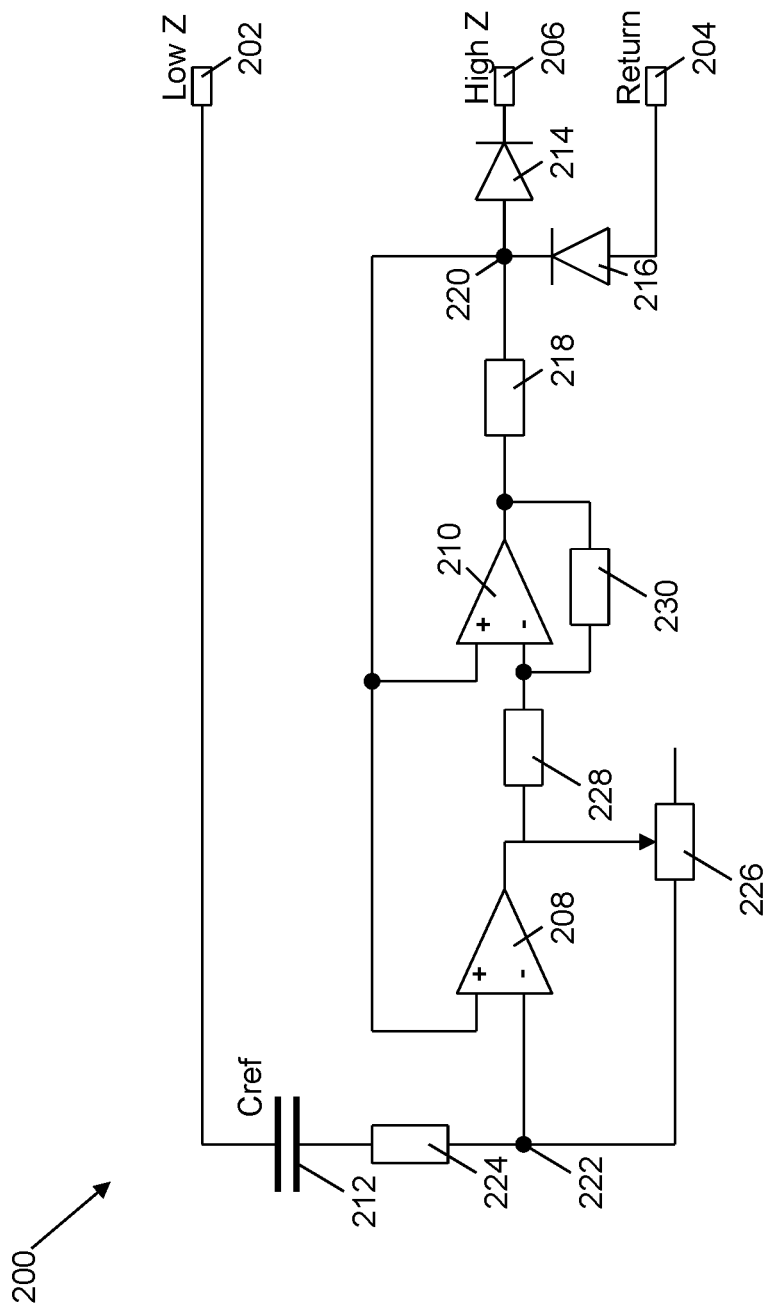
FIG. 3 is a schematic diagram of an implementation of the model of FIG. 2 realised using operational amplifiers.

FIG. 3 is a schematic representation of an exemplary implementation of the circuit illustrated in FIG. 2.

The circuit, shown generally at 200, includes a low impedance input terminal 202, a return terminal 204 and a high impedance terminal 206. As in the prior art circuit of FIG. 1, an AC excitation signal is input between the low impedance terminal 202 and the return terminal 204, and the output current is measured at the high impedance terminal 206.

The circuit 200 includes a first operational amplifier (op-amp) 208, which implements the functionality of the first amplifier 108 of the theoretical model of FIG. 2, and a second op-amp 210, which implements the functionality of second amplifier 210 of the theoretical model of FIG. 2. The reference capacitance 112 of the theoretical model of FIG. 2 is implemented in the circuit 200 by a reference capacitance 212, which may be, for example, a single precision capacitor.

The circuit 200 also includes first and second diodes 214, 216, which implement the functionality of the first and second diodes 114, 116 of the theoretical model of FIG. 2. The anode of the first diode 214 is connected, via a resistor 218, to an output of the second op-amp 210, whilst the cathode of the first diode 214 is connected to the high impedance terminal 206. Thus, the first and second diodes 214, 216 generate a half-wave rectified output signal which is output via the high impedance terminal 206.

The anode of the second diode 216 is connected to the return terminal 204, whilst the cathode of the second diode 216 is connected to the anode of the first diode 214. Thus, a node 220 is formed connecting the first diode 214 and the second diode 216.

The first op-amp 208 is configured as an inverting amplifier. The non-inverting input of the first op-amp 208 is connected to the node 220 which connects the anode of the first diode 214 to the cathode of the second diode 216. The inverting input of the first op-amp is connected to a node 222 which connects one terminal of the reference capacitance 212, via a series resistor 224 (which is operative to preserve the phase margin of the first op-amp 208, but otherwise has negligible effect on the operation of the circuit 200), to a variable resistor 226. The other terminal of the reference capacitance is connected to the low impedance input 202.

The variable resistor 226 permits the current output by the circuit 200 to be adjusted, in order to provide a precise and accurate simulation of a capacitance fuel probe. The variable resistor 226 may be implemented for example, using an electronically programmable resistor.

An output of the first op-amp 208 is connected to the variable resistor 226 and, via a resistor 228, to the inverting input of the second op-amp 210, which is configured as an inverting amplifier. The non-inverting input of the second op-amp 210 is connected to the node 220 which connects the anode of the first diode 214 to the cathode of the second diode 216, whilst, as indicated above, the output of the second op-amp 210 is connected, via the resistor 218, to the node 220 which connects the anode of the first diode 214 to the cathode of the second diode 216. A feedback resistor 230 connects the output of the second op-amp 210 to its inverting input.

The first op-amp 208 produces at its output a voltage that is proportional to the current through the reference capacitance 212, though as the first op-amp is a configured as an inverting amplifier the output voltage is inverted with respect to the current through the reference capacitance 212.

The second op-amp 210 receives at its inverting input the voltage output by the first op-amp 210, and outputs a voltage which is inverted with respect to the input voltage, and is thus proportional to the current through the reference capacitance 212. The output resistor 204 converts this output voltage to a current which is output to the first and second diodes 214, 216. The output current is dependent on the ratio of the value of the variable resistor 226 to the output resistor 204, and the simulated capacitance can be expressed as $$C_{sim} = C_{ref} \frac{R_g}{R_{out}},$$

where $C_{ref}$ is the capacitance of the reference capacitor 212, $R_g$ is the resistance of the variable resistor 226 and $R_{out}$ is the resistance of the output resistor 204.

Thus, by adjusting the resistance value of the variable resistor 226, the simulated capacitance can be adjusted. In the implementation illustrated in FIG. 3, the simulated capacitance is a decimal fraction of the reference capacitance in the range from 0 to 1.

The circuit implementation 200 illustrated in FIG. 3 is for simulating a DC capacitance fuel probe. The circuit 200 can be adapted to simulate an AC capacitance fuel probe by removing the first and second diodes 214, 216.

As will be appreciated, the circuit 200 permits precise and accurate simulation of a DC fuel probe (or, with appropriate alterations, an AC fuel probe) without requiring a large number of costly precision components, and without adversely affecting the diode compensation algorithms of the fuel gauge/conditioner unit used to drive the circuit and measure the output current. In contrast to existing (digital) approaches that produce a representative output current based on assumptions about the measurement circuit operation, the approach described above directly simulates the electrical properties of a capacitance fuel probe. For both AC and DC probes, the approach described above can be expected to be an accurate simulation with most conceivable measuring circuit properties. The reason for this is that the circuit uses purely analogue computation elements rather than analogue to digital to analogue conversion.

The invention claimed is:

1. A circuit for simulating a capacitance fuel probe, the circuit comprising:
   an input for receiving an alternating current (AC) excitation signal;
   an output for outputting an output signal representing a capacitance of the simulated fuel probe;
   a single reference capacitance;
   a first amplifier connected to the reference capacitance, the first amplifier being configured to cause a current flow through the reference capacitance;
   a second, variable gain, amplifier, the second, variable gain amplifier being configured to output an AC signal representing a multiple of the current flow through the reference capacitance, wherein the AC signal output by the second amplifier is used to generate the output signal, wherein a non-inverting input of the first amplifier is connected to a node that receives the AC signal output by the second amplifier and an inverting input of the first amplifier is connected to the reference capacitance.

2. A circuit according to claim 1 further comprising a first diode and a second diode which are operative to generate a half wave rectified output signal.

3. A circuit according to claim 1, wherein the reference capacitance comprises a single precision capacitor.

4. A circuit according to claim 1 further comprising a variable resistance for adjusting the gain of the second, variable gain, amplifier.

5. A circuit according to claim 4 wherein the variable resistance is implemented using an electronically programmable resistor.

6. A circuit according to claim 1 wherein the output signal represents a decimal fraction in the range 0 to 1 of the reference capacitance.

7. A circuit according to claim 1 further comprising an output resistor connected to the output of the second amplifier for converting the AC signal output by the second amplifier into an output current.

* * * * *